(12) United States Patent
Wu et al.

(10) Patent No.: US 8,742,868 B2
(45) Date of Patent: Jun. 3, 2014

(54) MICROSTRIP LINE STRUCTURES

(75) Inventors: Chia-Ho Wu, Tainan (TW); Tzong-Jer Yang, Hsinchu (TW)

(73) Assignee: Chung Hua University, Hsinchu (TW)

( * ) Notice: Subject to any disclaimer, the term of this patent is extended or adjusted under 35 U.S.C. 154(b) by 539 days.

(21) Appl. No.: 13/097,519

(22) Filed: Apr. 29, 2011

(65) Prior Publication Data

US 2012/0133454 A1  May 31, 2012

(30) Foreign Application Priority Data

Nov. 29, 2010 (TW) .............................. 099141204 A

(51) Int. Cl.
*H01P 3/04* (2006.01)
*H03H 7/38* (2006.01)

(52) U.S. Cl.
USPC .................................. 333/33; 333/238; 333/5

(58) Field of Classification Search
USPC ................ 333/238, 246, 33, 204, 205, 1, 4, 5
See application file for complete search history.

(56) References Cited

U.S. PATENT DOCUMENTS 5,877,123 A * 3/1999 Das .............................. 505/210
7,102,456 B2 * 9/2006 Berg ................................ 333/4

* cited by examiner

*Primary Examiner* — Stephen Jones
(74) *Attorney, Agent, or Firm* — WPAT, PC; Justin King

(57) ABSTRACT

The invention is related to a microstrip line structure, which comprises: a first microstrip line and a second microstrip line, paralleled with the first mircostrip line for transferring a transmission signal, and a plurality of grooves periodically arranged on both sides of the second microstrip line by using subwavelength, and each period length in the plurality of grooves is smaller than the wavelength of the transmission signal.

5 Claims, 8 Drawing Sheets

MICROSTRIP LINE STRUCTURES

TECHNICAL FIELD

The present invention relates to a microstrip line structure, and more particularly, to a microstrip line structure with a plurality of grooves subwavelength periodically arranged thereon.

TECHNICAL BACKGROUND

In recent years, as the electronic systems become more rapid and highly integrated, problems in the circuit design such as loss, crosstalk, reflection, and so on become more and more serious. Especially, there exist a great amount of parallel interconnection lines, which will bring about great coupling effect if they are to close to each other. For example, the signal on the transmission line would be distorted because of the crosstalk between lines. Also, the characteristic impedances of the transmission lines changes as a result of the crosstalk. When the signal is transferred in the transmission channel, it will generate the electromagnetic coupling so as to affect the neighboring circuit lines, and also it increases the coupling voltage and the coupling current on the interference signal. If the crosstalk is too large, it will effect the operation effectively of the circuit so as to generate the miss trigger of the circuit and damage the circuit. Beside, it always increase the intervals between the microstrip lines or control the raise and fall of the digital to suppress the crosstalk in high-speed circuit systems and system boards when the circuit lines are designed as the curved lines according to the actual requirement and design. However, this act still does not effectively solve the problem of the crosstalk.

For the reason that conventional technique could not effectively solve the issue of the crosstalk between the circuit lines, a need has arisen to propose a novel microstrip line structure capable of effectively solving the problem of the crosstalk.

TECHNICAL SUMMARY

According to one aspect of the present embodiment, the present invention provides a microstrip line to resolve issue of the crosstalk and transmission loss in the high-speed circuit so as to increase the transmission quality of the signal and reduce the size of the circuit board.

According to another aspect of the present embodiment, the present invention provides a microstrip line with a plurality of grooves subwavelength periodically arranged thereon. The shape and size of the grooves may be adjusted according to the actual requirement and design so as to support highly localized spoof surface plasmon ploaritons (SPPs) at microwave frequencies.

According to the other aspect of the present embodiment, the present invention provides a microstrip line with the curved lines. The microstrip line can be adjusted according to the actual requirement and design so as to decrease the crosstalk between the curved circuit lines.

In one embodiment, the present invention provides a microstrip line structure, comprising: a first microstrip line; a second microstrip line, parallelled with the first micro strip line, for transferring a transmission signal, and two sides of the second microstrip line have a plurality of grooves subwavelength periodically arranged on the two sides, and periodic length of the plurality of grooves is smaller than wavelength of the transmission signal.

In another embodiment, the present invention provides a microstrip line structure, comprising: a first microstrip line; and a second microstrip line, parallelled with the first micro strip line, for transferring a transmission signal, and two sides of the second microstrip line have a plurality of grooves subwavelength periodically arranged on the two sides, and opening of each groove has two extension parts serially expending to center of the groove, and periodic length of the plurality of grooves is smaller than wavelength of the transmission signal.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For your esteemed members of reviewing committee to further understand and recognize the fulfilled functions and structural characteristics of the disclosure, several exemplary embodiments cooperating with detailed description are presented as the follows.

Figure 1A:
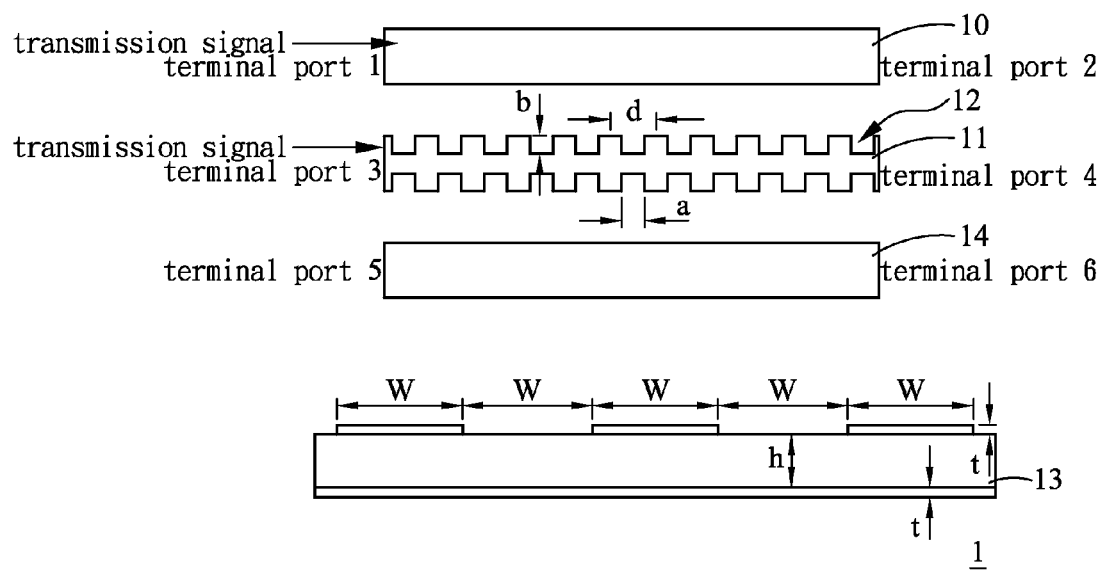
FIG. 1A shows a top view and a side view showing a microstrip line structure 1 according to one embodiment of the present invention.

FIG. 1A shows a top view and a side view showing a microstrip line structure 1 according to one embodiment of the present invention. The microstrip line structure 1 comprises a first microstrip line 10 and a second micro strip line 11, which is parallelled with the first micro strip line transfers a transfer signal, and two sides of the second microstrip line 11 have a plurality of grooves 12 subwavelength periodically arranged on the two sides, and periodic length of the plurality of grooves 12 is smaller than wavelength of the transfer signal. The microstrip line structure 1 further comprises a base plate 13 is used for mounting the first and second micro strip lines 10, 11 and a third micro strip line 14, which is mounted one side of the second micro strip line. Specifically, the first microstrip line 10 has two terminal ports 1, 2, the second microstrip line 11 has two terminal ports 3, 4 and the third microstrip line 14 has two terminal ports 5, 6. The first and third microstrip lines are also used for transferring signals. As set forth, the subwavelength periodic structure means that the periodic length is smaller the wavelength of the transfer signal, and the difference between the subwavelength periodic structure and the conventional periodic structure is, the periodic length of the conventional periodic structure is a quarter wavelength of the transfer signal, and the periodic length of the subwavelength is very smaller than a quarter wavelength of the transmission signal.

Figure 1B:
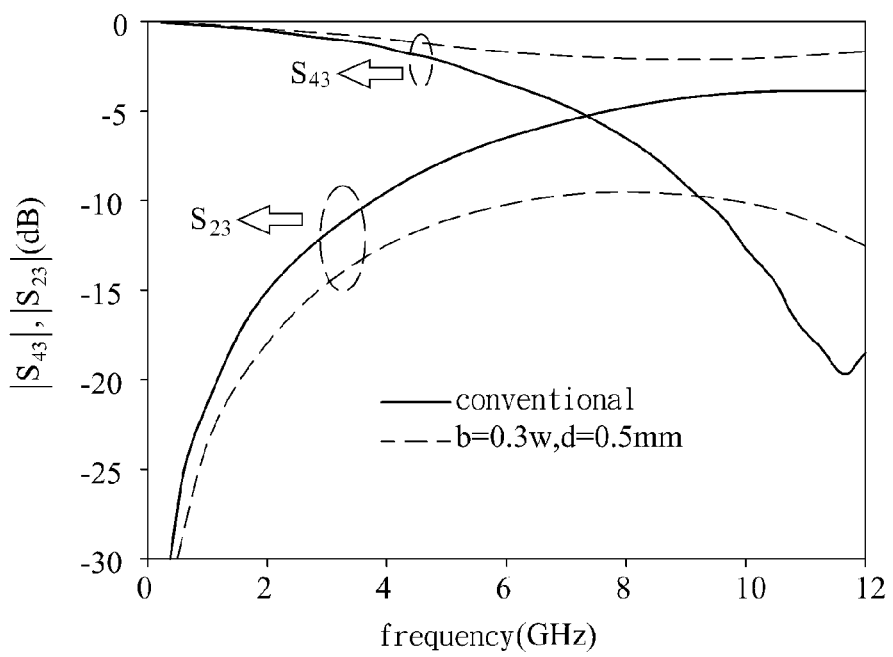
FIG. 1B is a schematic diagram showing a microstrip line structure 1 of FIG. 1A applied in the RO4003 base plate according to one embodiment of the present invention.

FIG. 1B is a schematic diagram showing a microstrip line structure 1 of FIG. 1 applied in the RO4003 base plate according to one embodiment of the present invention. In the embodiment, the first, second and third microstrip lines 10, 11 and 13 are copper material, and the width W of each microstrip line is 1.2 mm and thickness t is 0.0175 mm. The depth b of each groove 12 arranged on the second microstrip line 11 is 1 mm. Moreover, the word d indicates that period of the plurality of grooves 12 and the word a means that width of the each groove. The permittivity constant $\epsilon_r$ of RO4003 base plate (not shown in) is 3.37, the base plate thickness h is 0.0507 mm and range of the analyze bandwidth is 200 MHz~12 GHz. As shown in FIG. 1B for conventional microstrip line, two solid curved lines are S parameter of the feed point at terminal port 3, wherein the parameter $S_{43}$ indicates the part of transmission coefficient, and the parameter $S_{23}$ indicates the part of crosstalk, which is coupling from the terminal port 3 to the terminal port 2. As shown in FIG. 1B, the part of electromagnetic energy $S_{43}$ and the part of crosstalk energy $S_{23}$ cross near 7.6 GHz, and this meant that there is more energy feeding in another microstrip line after 7.6 Ghz so as to generate crosstalk at the another microstrip line and influence the circuit operation causing in miss trigger of circuit element. However, after applying the present invention, the part of transmission coefficient $S_{43}$ does not cross with the part of crosstalk energy $S_{23}$ (as shown in two dashed lines in the FIG. 1B), and it represents the curved line of the part of electromagnetic energy $S_{43}$ will be slow down along with the frequency drop. After applying the present invention, the part of crosstalk energy $S_{23}$ will be suppressed and is much less than the crosstalk generated by the conventional microstrip line, as shown in the dashed line of the part of crosstalk energy $S_{23}$.

Figure 2A:
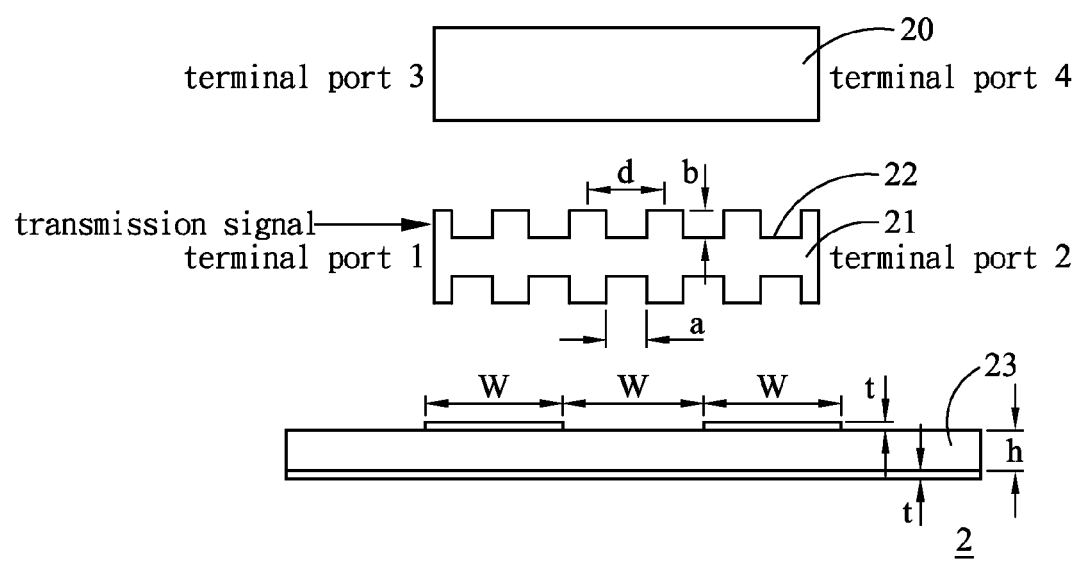
FIG. 2A shows a top view and a side view showing a micorstrp line 2 according to one embodiment of the present invention.
Figure 2B:
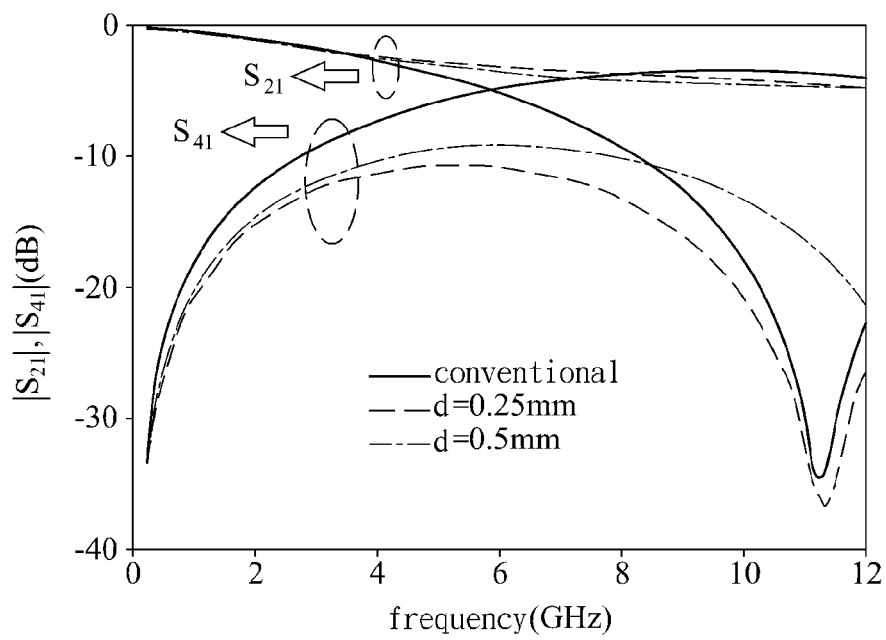
FIG. 2B shows the microstrip line structure 2 of the FIG. 2A applied in the FR4 circuit board according to one embodiment of the present invention.

FIG. 2A shows a top view and a side view showing a micorstrp line 2 according to one embodiment of the present invention. In the embodiment, the microstrip structure is similar as the structure disclosed by FIG. 1A, and the first and second microstrip lines 20, 21 may be mounted on a base plate 23. The difference between the microstrip structure of FIG. 2A and the 1A is the size and period of the groove 22 of the second microstrip line 21. The two sides of the first microstrip line 20 have terminal ports 3, 4 and the two side of the second microstrip line 21 have terminal ports 1, 2. FIG. 2B shows the microstrip line structure 2 of the FIG. 2A applied in the FR4 circuit board according to one embodiment of the present invention. The predetermined first and second microstrip lines 20, 21 are cooper material, and the width w of the microstrip line is 0.75 mm, thickness t is 0.035 mm, and the groove depth b of the second microstrip line is 0.3 w and width a is 0.5 d. The thickness of the FR4 circuit board (not shown in) is 0.4 mm. It effectively suppresses the crosstalk $S_{41}$, which is generated because energy flows into another conventional microstrip line. As shown in FIG. 2B, the generation rate of the crosstalk is getting smaller when the selected period d is getting smaller, and it meant that the groove structure with subwavelength may effectively suppress the electromagnetic energy. Thereby, the result of suppressing crosstalk is different along with the changes of the shape of groove.

Figure 3A:
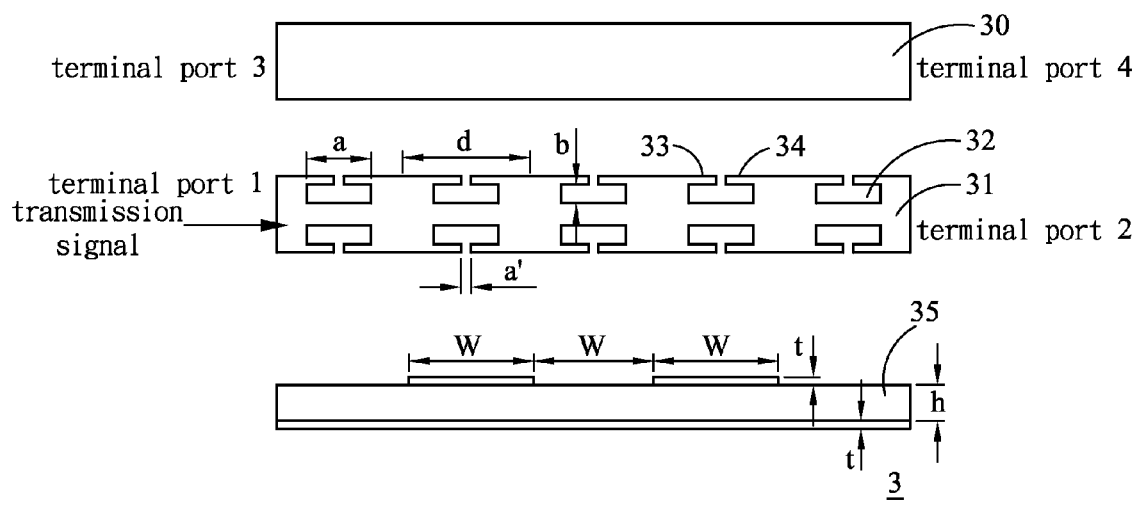
FIG. 3A shows a top view and a side view showing a microstrip line structure 3 according to another embodiment of the present invention.

FIG. 3A shows a top view and a side view showing a microstrip line structure 3 according to another embodiment of the present invention. The microstrip line structure 3 comprises a microstrip line 30 and a second microstrip line 31, which is parallelled with the first micro strip line transfers a transmission signal, and two sides of the second microstrip line have a plurality of grooves subwavelength periodically arranged on the two sides, and opening a' of each groove 32 has two extension parts 33, 34 serially expending to center of the groove, and periodic length of the plurality of grooves 32 is smaller than wavelength of the transmission signal. The microstrip line structure 3 further comprises a base plate 35 is used for mounting the first and second micro strip lines and a third micro strip line (not shown in), which is mounted one side of the second micro strip line. Specifically, the first, second and third microstrips respectively have two terminal ports, and the first and second microstrip lines are also used for transferring signals. In the embodiment, the first microstrip line 30 has two terminal ports 3, 4 and the second microstrip line 31 has two terminal ports 1, 2.

Figure 3B:
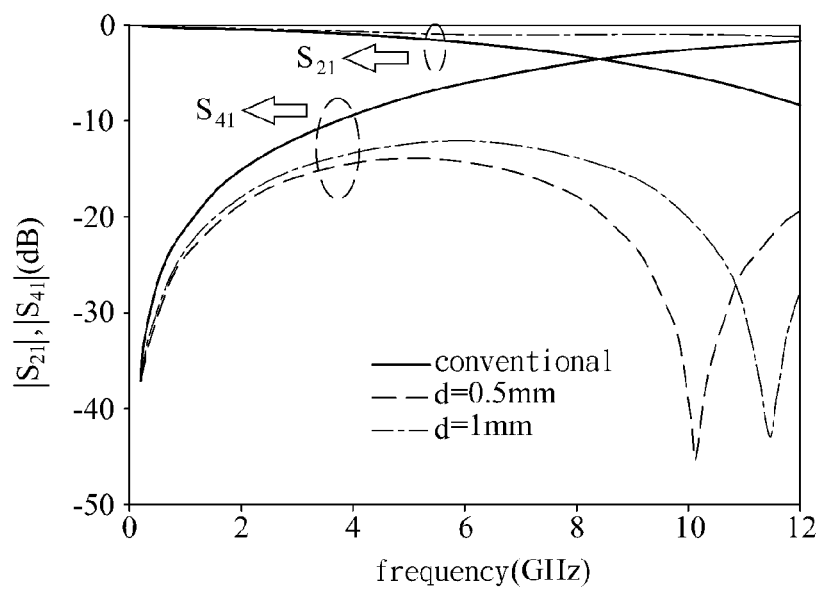
FIG. 3B is a schematic diagram showing the microstrip line structure 3 of the FIG. 3A applied in the RO4003 base plate according to one embodiment of the present invention.

FIG. 3B is a schematic diagram showing the microstrip line structure 3 of the FIG. 3A applied in the RO4003 base plate according to one embodiment of the present invention. As shown in FIG. 3B, the real curved line means the coupling between the conventional microstrip lines, and the dashed line with dot and the dashed line respectively mean the crosstalk between the microstrip with subwavelength and the neighboring conventional microstrip line. Moreover, it is obvious that the microstrip line structure of the present invention can further suppress the crosstalk $S_{41}$ between lines.

Figure 4A:
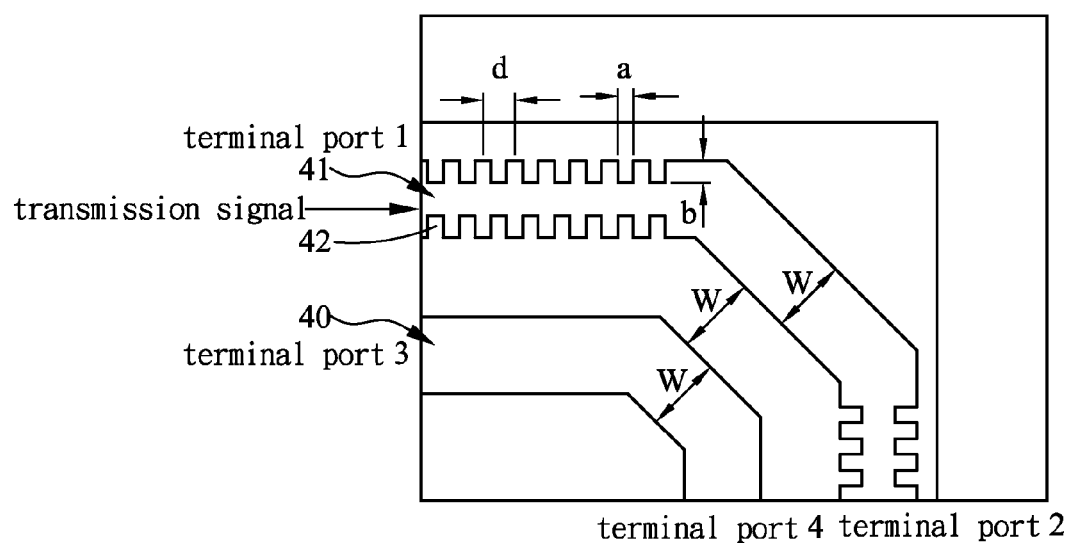
FIG. 4A shows a top view and a side view showing a microstrip line structure 4 according to one embodiment of the present invention.
Figure 4A:
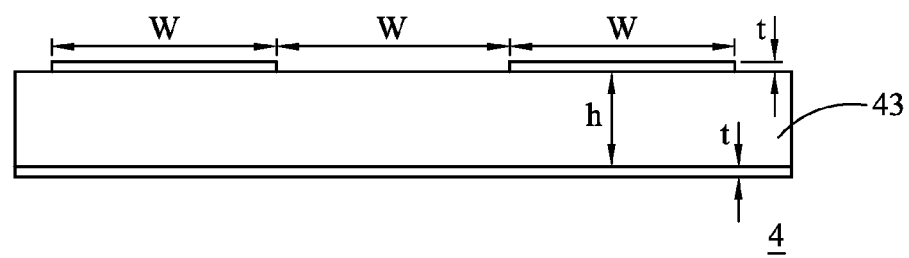
Figure 4B:
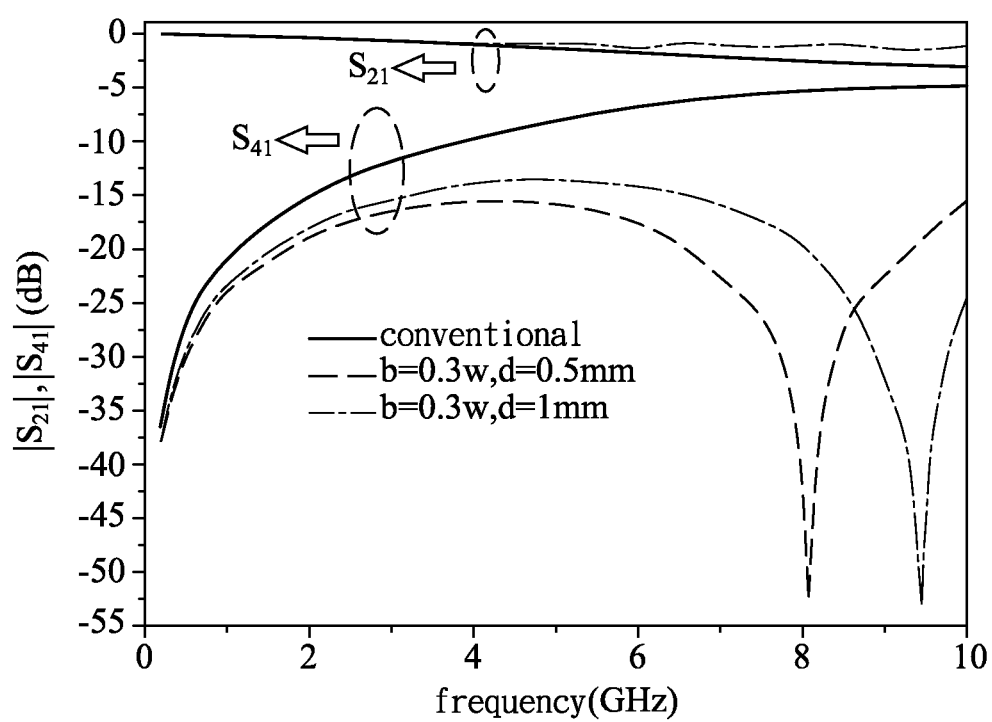
FIG. 4B shows an application embodiment of the microstrip line structure 4 of FIG. 3A.

Specifically, the transmission line (or the microstrip line) in the actual high-speed circuit must be curved according to the actual requirement and design, and therefore the present invention also decrease the crosstalk between the lines. FIG. 4A shows a top view and a side view showing a microstrip line structure 4 according to one embodiment of the present invention. The microstrip line structure 4 comprises: a first microstrip line 40 being a curved line and a second microstrip line 40, which is paralleled with the first microstrip line 40 transfers a transmission signal, and two sides of the second microstrip line 40 have a plurality of grooves 42 subwavelength periodically arranged on the two sides, and periodic length of the plurality of grooves 42 is smaller than wavelength of the transmission signal. The microstrip line structure 4 further comprises a base plate 43 is used for mounting the first and second micro strip lines 40, 41 and a third micro strip line (not shown in), which is mounted one side of the second micro strip line 41. Specifically, the first, second and third microstrips respectively have two terminal port. In the embodiment, the first microstrip line 40 has two terminal ports 3, 4, and the second microstrip line 41 has two terminal ports 1 and 2. FIG. 4B shows an application embodiment of microstrip line structure 4 of FIG. 3A. In the embodiment, it selects two periodic d=10 mm and d=0.5 mm, and the groove depth of the second microstrip is 0.3 W. As shown in FIG. 3B, the real curved line indicates that the crosstalk between the conventional microstrip line, and the dashed line with dot and the dashed line respectively indicates the crosstalk between the microstrip line with subwavelength and the neighboring conventional microstrip line. Based on the results as above, the present invention still effectively suppresses the crosstalk between the curved lines.

In accordance with the embodiment described mentioned above, the skilled person in the art should understand the size of the groove is adjusted for being applied to any base plate and circuit according to the actual requirement and design so as to suppress the crosstalk. Additionally, it must consider that impedance matching when the microstrip line structure is used to transfer signal in actual application. Therefore, a impedance gradation area (not shown in) is added in a terminal of the microstrip line or the microstrip line with subwavelength of the present invention for effectively suppressing undesired signal reflection between the microstrip lines because the impedance mismatch so as to decrease the transmission signal interference. Moreover, the structure of the impedance gradation area has one or more grooves arranged on two sides of the impedance gradation area, and the size of the grooves can be adjusted by the subwavelength according to the stronger/weaker impedance mismatch between the microstrip lines, for example, the depth of the groove, so as to avoid the signal distortion or the circuit element damage because the signal or frequency reflection with wide variation. Therefore, the impendence gradation area also decreases the dither frequency on the microstrip line with subwavelength.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A microstrip line structure, comprising:
    a first microstrip line; and
    a second microstrip line, parallelled with the first micro strip line, for transferring a transmission signal, and two sides of the second microstrip line have a plurality of grooves subwavelength periodically arranged on the two sides, an opening of each groove has two extension parts serially extending to the center of the groove, a periodic length of the plurality of grooves is smaller than wavelength of the transmission signal.

2. The microstrip line structure of claim 1, wherein the first microstrip line is one of a straight line and a curved line, and the second microstrip line corresponding to the first microstrip line is the straight line/curved line.

3. The microstrip line structure of claim 1, further comprising:
    an impedance gradation area, coupled to one terminal of the first/second microstrip line, and the impedance gradation area comprises a plurality of groove with different sizes.

4. The microstrip line structure of claim 1, further comprising:
    a base plate, for mounting the first and second micro strip lines and a third micro strip line, which is mounted one side of the second micro strip line.

5. The micro strip line of claim 4, wherein the first, second and third microstrips respectively have two terminal ports.

* * * * *